(12) United States Patent
Michalsky et al.

(10) Patent No.: US 12,039,801 B2
(45) Date of Patent: Jul. 16, 2024

(54) DEVICE FOR CAPTURING IMPRESSIONS OF AUTOPODIA AND USE OF SAME

(71) Applicant: JENETRIC GmbH, Jena (DE)

(72) Inventors: Tom Michalsky, Zwenkau (DE); Undine Richter, Jena (DE); Philipp Riehl, Jena (DE); Daniel Krenzer, Wutha-Farnroda (DE); Jörg Reinhold, Jena (DE); Jürgen Hillmann, Jena (DE)

(73) Assignee: DERMALOG JENETRIC GmbH, Jena (DE)

( * ) Notice: Subject to any disclaimer, the term of this patent is extended or adjusted under 35 U.S.C. 154(b) by 0 days.

(21) Appl. No.: 18/042,692

(22) PCT Filed: Jul. 21, 2021

(86) PCT No.: PCT/EP2021/070429
§ 371 (c)(1),
(2) Date: Feb. 23, 2023

(87) PCT Pub. No.: WO2022/042957
PCT Pub. Date: Mar. 3, 2022

(65) Prior Publication Data
US 2023/0386248 A1 Nov. 30, 2023

(30) Foreign Application Priority Data

Aug. 26, 2020 (DE) ...................... 10 2020 122 312.9

(51) Int. Cl.
*G06V 40/13* (2022.01)
*G02B 5/28* (2006.01)
(Continued)

(52) U.S. Cl.
CPC ........... *G06V 40/1318* (2022.01); *G02B 5/28* (2013.01); *G06V 10/143* (2022.01);
(Continued)

(58) Field of Classification Search
CPC ............. G06V 40/1318; G06V 10/143; G06V 40/12–1394; G02B 5/28; G09G 3/32; G09G 2320/0233; G09G 2354/00
See application file for complete search history.

(56) References Cited

U.S. PATENT DOCUMENTS

| 2015/0155400 A1 | 6/2015 | Xue et al. |
| 2017/0017824 A1 | 1/2017 | Smith et al. |

(Continued)

FOREIGN PATENT DOCUMENTS

| CN | 109033926 A | 12/2018 |
| DE | 10 2018 122 872 A1 | 3/2020 |
| WO | WO 2019/051705 A1 | 3/2019 |

*Primary Examiner* — Premal R Patel
(74) *Attorney, Agent, or Firm* — Christensen, Fonder, Dardi & Herbert PLLC

(57) ABSTRACT

A device for displaying information and for the contact-based, simultaneous capture of impressions of a plurality of blood-perfused skin regions of human autopodia, including: a placement surface for placing the autopodia, a display unit which is arranged below the placement surface and which has at least partially transparent display elements which are arranged in grid form and are individually controllable by a control unit, the display elements having display pixels which emit light in a direction of the placement surface. The device also includes optical sensor pixels which detect light incident on the sensor pixels. The sensor pixels may be arranged in a sensor layer arranged under the display unit viewed from direction of the contacting skin region or may be arranged in the display unit between the display elements. A cavity filter for angle selection is arranged in front of the optical sensor pixels.

24 Claims, 8 Drawing Sheets

(51) Int. Cl.
  *G06V 10/143* (2022.01)
  *G06V 40/12* (2022.01)
  *G09G 3/32* (2016.01)

(52) U.S. Cl.
  CPC ........... *G06V 40/1394* (2022.01); *G09G 3/32* (2013.01); *G09G 2320/0233* (2013.01); *G09G 2354/00* (2013.01)

(56) References Cited

U.S. PATENT DOCUMENTS

| | | | |
|---|---|---|---|
| 2020/0387684 A1* | 12/2020 | Setlak | G06F 3/0421 |
| 2021/0160414 A1* | 5/2021 | Fu | H04N 23/70 |
| 2021/0286967 A1 | 9/2021 | Hillmann et al. | |
| 2021/0325735 A1* | 10/2021 | Liao | G02F 1/133617 |
| 2021/0326561 A1* | 10/2021 | Qiu | G06V 40/1318 |
| 2022/0037431 A1* | 2/2022 | Shih | G06V 40/1359 |

\* cited by examiner

DEVICE FOR CAPTURING IMPRESSIONS OF AUTOPODIA AND USE OF SAME

PRIORITY CLAIM

The present application is a National Phase entry of PCT Application No. PCT/EP2021/070429, filed Jul. 21, 2021, which claims priority from German Patent Application No. 10 2020 122 312.9, filed Aug. 26, 2020, the disclosures of which are hereby incorporated by reference herein in their entirety.

FIELD OF THE INVENTION

The invention is directed to a device for displaying information and for the contact-based, simultaneous capture of impressions of a plurality of blood-perfused skin regions of human autopodia. The device comprises a placement surface for placing the autopodia, a display unit which is arranged below the placement surface viewed from a direction of a contacting skin region and which has at least partially transparent display elements which are arranged in grid form and are individually controllable by means of a control unit, the display elements having display pixels which emit light in direction of the placement surface. The device further comprises optical sensor pixels which detect light incident on the sensor pixels from direction of the placement surface. In a first alternative, the sensor pixels are arranged in a sensor layer arranged under the display unit viewed from the direction of the contacting skin region. In a second alternative, the sensor pixels are arranged in the display unit between the display elements.

BACKGROUND OF THE INVENTION

The current global development of cellular devices and mobile telephones shows that the demand for a reliable user authentication is increasingly significant because data-sensitive applications such as, for example, mobile banking with modern mobile telephones, also known as smartphones, can increasingly be carried out with such mobile telephones. There are various methods for authenticating users. However, a biometric authentication by means of fingerprints lends itself as a solution precisely for data-sensitive applications because appreciably more information is encoded in the papillary structure of the human finger than, for example, in the face. For this reason, authentication by means of fingerprints offers more security than authentication by means of facial recognition. Authentication by means of an individual fingerprint has long been known in the prior art. However, greater security is afforded by authentication in which the impressions of a plurality of fingers are used simultaneously.

While a corresponding area can be reserved on the surface of the mobile telephone for authentication by means of an individual fingerprint, the area required for authentication by means of a plurality of fingerprints would be too large and too little space would remain for displaying information.

Therefore, for space-related reasons and from an ergonomic perspective, a solution which is integrated in the display screen of the mobile telephone—over the entire surface, if possible—and which does not visually impair the display screen, i.e., does not reduce brightness, for example, is desirable for multi-finger authentication. The battery life of the mobile telephone should also be impacted as little as possible.

So as not to impair the image quality of the display screen, or display, a sensor layer designed to detect fingerprints must be arranged under the imaging elements—or display pixels—of the display. This relates both to brightness and to parallax errors occurring to an increased degree as the layer thickness over the display increases.

Arranging the sensor layer under the display screen increases the distance between a finger on the placement surface and a sensor in the sensor layer, which results in an appreciable reduction in quality in the biometric recording. Depending on the backlight used for the display, additional problems may result: the use of a partially transparent, LED-based backlight results in intensity losses when the sensors are arranged under the backlight. If an LCD-based backlight is used, it is generally opaque, which rules out an arrangement of the sensor layer under the backlight as viewed from the placement surface.

PRIOR ART

Combinations of displays and sensors in which an optical image sensor—CMOS, TFT, CCD, etc.—is linked with a display screen—OLED, QLED, LCD, etc.—already exist in prior-art mobile devices. Moreover, such mobile devices are additionally outfitted in most cases with a touch-sensitive layer, also known as a touchpad or touchscreen panel, in order to allow screen inputs by means of a finger and/or a pen.

The optical image sensor captures skin prints which, for example, are compared with data stored in the system in order to determine and possibly verify the identity of the user and/or also in order to enable particular functions of applications which can be associated with specific fingers.

In known mobile devices, the touch-sensitive area of the display screen simultaneously functions as a placement surface for capturing skin prints. This has the advantage that an area of the display surface need not be set apart for capturing biometric features. In this way, the effective area for displaying information can be increased compared to the area outside of the display screen.

Optical image sensors are preferably used for capturing skin prints because, in contrast to capacitive sensors and sensors based on the use of ultrasound, they have the advantage that high-resolution recordings can be realized with them even over larger distances between the image sensor and the biometric object to be captured. This is important, for example, when additional cover films or cover glasses are applied to the surface of the display screen by the user of the mobile device in order to protect against scratches or glass breakage, for example.

WO 2019/051705 A1 describes an approach in which an additional light source mounted laterally at the display is used for imaging for recording fingerprints. In this case, a filter—a color filter or a dielectric multi-layer filter—which passes the light emitted by the additional light source and reflects or absorbs light of other spectral ranges is used. This additional light source is arranged laterally so as not to interfere with the backlighting of the display screen. This arrangement is suitable for capturing an individual fingerprint but not for capturing a plurality of fingerprints simultaneously because only one additional light source is used whose light illuminates the placement surface only partially and not completely. It is also not possible to detect fakes with this arrangement, i.e., copies of fingerprints on paper, for example.

Another approach is described in CN 109033926 A. In this case, an area light source is arranged under a semitransparent optical sensor. A filter—a color filter or a dielectric multi-layer filter—is arranged above the optical sensor to suppress scatter light or ambient light. The brightness and brilliance of the display screen are severely impaired as a result of the arrangement of the optical sensor above the light source due to the semitransparency of the optical sensor resulting in a grave disadvantage for a user.

SUMMARY OF THE INVENTION

Therefore, it is the object of the invention to develop an arrangement by which skin prints, particularly of a plurality of fingers, can be captured simultaneously with uniformly high quality on the entire surface of the display screen without perceptibly impairing the brightness or brilliance of the display screen. At the same time, by means of a correspondingly implemented detection method, the arrangement shall be capable of distinguishing between a genuine finger and a fake, for example, a piece of paper with the photograph of a fingerprint, in the captured skin print.

The above-stated object is met for a device of the type described in the introductory part in that means for angle selection are arranged in front of the optical sensor pixels in direction of the placement surface. The means for angle selection comprise at least one cavity filter. This type of filter is already known from the prior art—for example, in the form of cavity resonators in radio technology—and is transmissive for certain frequency ranges but blocks all other frequency ranges. Therefore, it acts as a wavelength filter. However, it has turned out that cavity filters also have an angle-selective characteristic: light of the wavelength range or of the wavelength with which the cavity filter is resonant and therefore maximally transmissive is generally only passed if it impinges in a narrow angular range around a perpendicular bisector on a surface of the cavity filter which is usually constructed as a layer stack. The angular range depends on the materials used for the cavity filter and generally comprises a conical area with a cone angle or opening angle of approximately 20°. The lower the effective refractive index of the cavity filter or mirror structure, the smaller the cone angle and the stronger the filter effect in the angular range. However, for light of the wavelength range for which the cavity filter is actually transmissive but which impinges on the layer stack of the cavity filter at angles greater than the opening angle of the cone, the transmittance falls off sharply and, depending on the quantity of filtering layers, can be forced down to zero.

However, at the same time, the cavity filter also acts in an angle-selective manner on other wavelengths: for longer wavelengths, the cavity filter is transmissive in an angular range outside of the transmission cone described above. The angular range depends on the wavelength. This can be utilized to detect fakes as will be described later.

The cavity filter or cavity filters are also constructed depending on the construction of the optical sensor pixels. In case the optical sensor pixels are arranged in the display unit between the display elements, one or more pixelated cavity filters is associated with each sensor pixel and is arranged above the respective sensor pixel. In case the optical sensor pixels are arranged in a sensor layer below the display unit, the at least one cavity filter is formed as a cavity filter layer which is arranged between the display unit and the sensor layer.

There are also various possibilities for configuring the display unit. In a first configuration, the display unit comprises actively luminous display pixels. It is preferably configured as an LED unit with display pixels which are formed as LEDs, OLEDs, QLEDs or microLEDs. In a mobile device such as a smartphone the display unit is located below the placement surface which is generally a protective layer under which a touch-sensitive layer, also known as a touchpad, is arranged. The touchpad is optional and not necessary for the functioning of the invention. However, it does make it easier to determine whether or not a finger is placed on the placement surface. The lateral dimensioning of the protective layer, touchpad, display unit, cavity filter and optical sensor are preferably identical. The LED unit is arranged directly below the touchpad and is semitransparent, i.e., transmissive for light of most wavelengths, although the light is attenuated. No additional layers such as filters or sensors should be introduced above the LED unit so as not to impair the brightness and brilliance of the display.

In a second, alternative configuration, the display unit comprises passively illuminated display pixels. The latter must be illuminated and, for this purpose, a first illumination unit with a transparent light guide layer body and first illuminants is arranged below the display unit and above the cavity filter or cavity filters viewed from the placement surface. The display pixels are diffusely illuminated by means of the light guide layer body in a first wavelength range. The display unit is preferably configured as an LC unit with display pixels formed as LC elements. In this connection, the term "LC unit" specifically refers to the transmissively switchable pixel structure, excluding the illumination thereof. An LC unit typically comprises a layer stack polarizer—color filter (in color display screens)—LC backplane polarizer. As concerns the invention, it is immaterial whether the LC unit is a color unit or black-and-white unit. No additional layers such as filters or sensors should be introduced above the LC unit so as not to reduce the brightness or brilliance of the display.

The first illumination unit comprises a transparent light guide layer body which comprises one or more transparent layers and provides for a diffuse backlighting of the LC unit, the light being radiated into the light guide layer body from the side or from below. The light guide layer body must be transparent so that a sensor can be arranged as bottommost layer for capturing skin prints and can still detect light coming from the placement surface. This configuration differs from the usual lighting configurations for LC units. Backlights for LC units are usually opaque because they have a highly reflective layer on their underside which reflects light emitted downward and accordingly increases efficiency. When suitably configured, the highly reflective layer can be realized in the present invention by the cavity filter because most of the visible spectrum is reflected by the cavity filter. In this way, energy efficiency can be achieved in a manner comparable to conventional backlights for LC units.

In contrast, LC units having an opaque backlight are usually used in the prior art. Consequently, the optical sensor must be arranged above the LC backlight, which reduces the efficiency of the backlight and impairs the image quality, which affects the recording of fingerprints.

Particularly when using a display unit with passively illuminated display pixels, it is especially advantageous to utilize a second illumination unit with second illuminants which are formed for emitting directed light of a predetermined wavelength, the emission being carried out in a limited angular range of not more than 20° around a predetermined central direction. The second illuminants can likewise couple the light into the light guide layer body. The central direction is determined depending on the predetermined wavelength of the directed light and on an angle selectivity of the at least one cavity filter for the predetermined wavelength. It preferably extends parallel to a normal of the placement surface. When the light is emitted from the side, then based on intercept theorems and imaging rules, there are possibly other directions in which the light must be emitted which do not correspond to the central direction. The angular range of the directed illumination can be between 0° and 70° relative to the surface normal of the placement surface and can be selected in such a way, for example, that the principle of total internal reflection is utilized. The use of additional illumination via second illuminants has the advantage that wavelength ranges specific to the fingerprint recording can be selected. These wavelength ranges are utilized only for the fingerprint recording and also need not lie within the visible spectrum, for example. Cavity filters and optical sensors can then be tuned specifically to these wavelength ranges.

The second illumination unit can also be provided whether or not a first illumination unit is present and, in particular, can also be provided when actively illuminated display pixels are used—OLEDs are partially transparent but only transmit about 5% of the light. Irrespective of the first illumination unit, the second illumination unit can also be arranged at other places in the layer stack between the placement surface and optical sensor layer, for example between the protective layer and touchpad, above the display unit and below the touchpad, between the display unit and cavity filter layer, or also between the cavity filter layer and the sensor layer.

The cavity filter or plurality of cavity filters can be variously configured. In a first configuration, the cavity filters are configured as individual cavity filters. However, in order to delimit the transmissive range more sharply over the blocked range, the use of dual-cavity filters or multi-cavity filters is also possible. All cavity filters are characterized in that they are formed as layer stacks with plane reflector layers and plane cavity layers separating the reflector layers. The layers are arranged parallel to the placement surface, and the thickness of the cavity layers is determined depending on a wavelength range to be transmitted for capturing impressions of a plurality of blood-perfused skin regions of human autopodia and on an angular range to be selected by the cavity layers for this wavelength range.

An individual cavity filter basically comprises a—metal or dielectric or combined metal-dielectric—cavity layer with an optical thickness on the order of the light wavelength to be transmitted. The cavity layer is located between two reflector layers. The reflector layers can be formed as metal layers or all-dielectric mirrors. The reflector layers are preferably configured as Bragg mirrors comprising alternating layers of two dielectrics or a metal. The insertion of the cavity layer, also known as a "spacer", leads to the formation of so-called cavity modes which are formed as transmissive wavelength ranges or bands in the reflection range of the reflector layers. The use of dual-cavity filters or multi-cavity filters leads to an improved line form of the transmissive region from the curve shape of a Lorentz curve through to a box shape. As has already been mentioned, the at least one cavity layer can be metallic or dielectric or formed as a combination of metallic and dielectric materials. A combination of metal layers and dielectric layers leads to an improved selection of the angular range.

Cavity filters can be made from various materials. In all-dielectric cavity filters, layers of at least two different materials with appreciably different refractive indices can be used. For example, titanium dioxide with a refractive index of 2.6 or zinc sulfide with a refractive index of 2.35 can be used as reflector layers. Silicon dioxide with a refractive index of 1.46 or cryolite with a refractive index of 1.35, for example, are contemplated as material for the cavity layers. Other suitable materials are, for example, MgF, $CeO_2$, $Al_2O_3$, MgO, SiO, $ZrO_2$, $CeF_3$ or other oxides and fluorides. The cavity filter can also be metallic-dielectric with a metallic component in the cavity layer for suppressing sidebands. Aluminum, gold, silver, molybdenum, inter alia, are contemplated as metals, for example. The cavity filters can be produced, for example, by means of CVD, MB MBE, ALD, PVD, magnetron sputtering, PIAD, PECVD, etc.

The thickness of the at least one cavity layer can be variably adjustable for a fine adjustment of the wavelength range which is selected through transmission. Piezoelectric materials, to name one example, are particularly suited to this purpose.

The cavity filters or cavity filter preferably reflects light which, in case of active display pixels, is emitted by the latter or which, in case of passive display pixels, is emitted by an illumination unit in direction of the sensor pixels in order to increase the luminous efficiency of the display.

As has already been mentioned in the introduction, the angle selection of the cavity filter depends heavily on the spectral difference between the cavity mode and the light source. In resonant mode, only light of the resonant wavelength impinging on the layer stack at an angle close to the vertical is transmitted. In case of no resonance, light is transmitted in a transmission cone whose cone angle and thickness—an angular range around the vertical is cut out—depends on the wavelength of the light.

If the light of a plurality of spectrally diverse light sources is to be transmitted in an angle-selective manner, the cavity filter must be correspondingly adapted. For example, the thickness of the cavity layer can be increased so that a plurality of wave trains can fit into it.

The insertion of the cavity filter makes it possible to limit the angular range of the light to be transmitted. Accordingly, the angular range of the light which can be detected by the sensor is also limited. For spectrally narrow light sources, for example, for lasers or monocolored LEDs, a limitation can be carried out with perpendicular incidence on the filter at an angle of approximately around the normal on the layer stack. Correspondingly, the point spread function (PSF) is also narrower. The dependency of the normalized modulation on the spatial frequency is specified via the modulation transfer function (MTF) which corresponds to the amount of the Fourier transform of the PSF. The normalized modulation is given by the difference of the maximum and minimum at a given spatial frequency k divided by this difference, where k>0.

For the human fingerprint, a period length of approximately 400 μm is measured from ridge to ridge; this corresponds to a frequency of k=2.5 line pairs per millimeter. Looking at the PSF which results from the reflection of a typical display screen illumination on the placement surface, it is evident that without the use of a cavity filter the modulation, assuming a cover layer thickness—the distance between the placement surface and the sensor—of more than 300 μm, approximates zero so that fingerprints can no longer be clearly detected. Therefore, without the use of a cavity filter, the distance between optical sensors and the placement surface may not amount to more than 300 μm, which sharply limits the possibilities for using displays in connection with the detection of fingerprints. However, current common cover layer thicknesses—i.e., the thickness of the series of layers over the sensor layer—are appreciably higher and vary within the range of between 500 μm and 1600 μm. However, when a resonant cavity filter is introduced, which realizes an angle selection of the signal of a maximum 10° around the vertical, clear contrasts can also be measured for cover layer thicknesses greater than 800 μm.

The maximum possible cover layer thickness can be further increased through additional steps. For example, each of the sensor pixels can be provided with an additional shutter as described in DE 10 2018 122 872 A1. This further reduces the selected angular range, and cover layer thicknesses between the sensor and placement surface of more than 1 mm can be realized. Clear contrasts can also be measured in this thickness range. The additional shutters are arranged along rows and columns in which the sensor pixels are arranged, for example, in alternating form.

The optical sensor pixels advisably comprise various color sensor pixels which are alternately arranged in columns and rows in which the sensor pixels are arranged. This makes it possible to increase accuracy particularly in detecting fakes.

Two possibilities for using the above-described device to determine whether an object placed on the placement surface is an autopodium or a forgery of an impression of an autopodium will be presented in the following.

The at least one cavity filter is constructed in both cases as a layer stack comprising planar reflector layers and planar cavity layers separating the reflector layers. The reflector layers and the cavity layers are arranged parallel to the placement surface, and an object is placed on the placement surface. The optical sensor pixels are also switched on to detect light in both cases.

Both uses are based on differences in the detection for genuine fingerprints on the one hand and for forged prints, for example, in the form of copies on paper, on the other hand. Human skin can be described approximately as a highly scattering medium with a refractive index of between 1.43 and 1.45. This has the result that for angles at which the light impinges on the placement surface from below and which are less than 70°, no total internal reflection occurs when skin comes in contact with the placement surface, the material of which is, for example, glass with a refractive index of around 1.52. During the detection of fingerprints, the skin ridges lie on the placement surface, but the skin valleys do not. Consequently, skin ridges appear darker in a fingerprint image. If a faked fingerprint, for example, a completely flat paper copy or the like, is placed on the surface, there is generally no occurrence of total internal reflection at the transition from glass to air at the placement surface. Accordingly, there is also no drop in intensity in the area of the forged skin ridge and no fingerprint is recorded in the image.

The two methods described in the following use the wavelength-dependent angle selectivity of the cavity filter while making use of the effect of total internal reflection for detecting fakes.

In one possible use, the display pixels are switched in the next step in such a way that they emit light of at least a first wavelength which corresponds to a central wavelength of the at least one cavity filter. The cavity filter has the highest transmission for this central wavelength and is therefore resonant with light of this first wavelength. For this reason, it is transparent in a first angular range around a direction perpendicular to the placement surface. For example, green light with a wavelength of about 550 nm can be used as first wavelength. The illumination can be carried out in the usual RGB mode, but for green light only angles around the vertical, i.e., around 0° relative to the perpendicular bisectors of the placement surface, are allowed to pass through the cavity filter. The green component of the light can accordingly be used for imaging the fingerprint. A first overall image is captured by means of the sensor pixels. In RGB illumination, for detecting the angles around the vertical the other wavelengths are filtered out when all of the subpixels—an RGB color pixel is usually composed of a plurality of subpixels emitting monochromatic light in the basic colors red (R), green (G), and blue (B)—emit light simultaneously, or a color-selective illumination is carried out in which not all of the subpixels are switched on. It is advantageous when the display pixels are switched for capturing the first overall image such that they only emit light of the first wavelength.

For capturing a second image, the display pixels are switched such that they emit light of a second wavelength. This second wavelength is shorter than the first wavelength and is selected in such a way that the cavity filter is also transparent to this wavelength but in a second angular range which cuts out a cone or conical ring around the direction perpendicular to the placement surface. For example, for the recording of the second overall image—all of the optical sensors record image data—the second wavelength amounts to 460 nm, and the display pixels accordingly emit blue light. A suitable cavity filter can be formed all-dielectric, for example, i.e., both the reflector layers and the cavity layer(s) comprise dielectric materials.

In this configuration, a second overall image is captured. By comparing the differences in image characteristics in the first overall image and second overall image, it can be detected whether or not a forgery has been placed on the placement surface. An important image characteristic in this case is the intensity. If an actual human finger is placed on the placement surface, the detected signal decreases substantially when illuminated with light of the second wavelength because the total internal reflection is frustrated. Conversely, if a forgery is placed on the placement surface, an air gap remains between the paper and the placement surface so that the total reflection is not frustrated. Accordingly, the intensity does not decrease compared to the first overall image. Additional overall images with different colors can also be captured to increase the accuracy of forgery detection provided the cavity filter is transparent to these colors or wavelengths in determined angular ranges.

Depending on the results of the analysis and comparison of the image characteristics of the overall images, further steps are undertaken. To verify a forgery, the intensity ratios of the two overall images can further be compared with a calibrated threshold range, for example, for detecting forged prints. With the same goal, all of the overall images can be superposed in order to achieve increased resolution or compensate for sensor defects and other errors in the image recording. When a genuine fingerprint is detected and identified as an authorized fingerprint, one or more functions can be enabled in an appliance in which the device is implemented. When a forged fingerprint is detected, the appliance can be locked. These steps are mentioned by way of example; further steps which will be apparent to the person skilled in the art but which are not mentioned herein can also be carried out.

While a plurality of overall images of various colors are captured successively in the first possible use, which can take a significant amount of time depending on the speed of a processor in which the image processing is carried out, this disadvantage is overcome in a second possible use in that a plurality of images are captured simultaneously. To this end, the illumination and/or the detection must be correspondingly switched or controlled by means of sensor pixels. Specifically, a first set of display pixels is switched in such a way that the first set of display pixels emits light of at least a first wavelength which corresponds to a central wavelength of the at least one cavity filter. The cavity filter is resonant with light of this first wavelength and is selective, i.e., transparent, in a first angular range around a direction perpendicular to the placement surface. A second set of display pixels is switched in such a way that the second set of display pixels emits light of a second wavelength which is shorter than the first wavelength. The cavity filter is selective, i.e., transparent, to light of the second wavelength in a second angular range. The second angular range cuts out a cone or cone ring around the direction perpendicular to the placement surface.

Accordingly, not all of the display pixels are used simultaneously for illumination in one wavelength or the other, but rather one portion of the display pixels emits light of the first wavelength and another portion emits light in a second wavelength. The first set of display pixels and the second set of display pixels preferably complement one another, i.e., every display pixel emits either light of the first wavelength or light of the second wavelength. The positions of the first set of display pixels and of the second set of display pixels in the display unit are so determined depending on the first wavelength and second wavelength and the respective selective angular ranges that, on the one hand, the light emitted by the first set of display pixels and by the second set of display pixels illuminates the same area of the placement surface from below and, on the other hand, light of the first wavelength which is incident on the sensor pixels from the direction of the placement surface is detected by means of a first set of sensor pixels and is captured as first image, and light of the second wavelength which is incident on the sensor pixels from direction of the placement surface is detected by a second set of sensor pixels and a second image is captured simultaneously. In contrast to the first use, only a portion of the sensor pixels, but not all of the sensor pixels, is utilized in this case for capturing an individual image. Therefore, there is no overall image captured by utilizing all of the sensors or at least almost all of the sensors, but rather only one image is captured with an appreciably smaller portion of sensors. Analogous to the first use, the first image and second image are analyzed with respect to differences in their image characteristics and further steps are carried out depending on the results of the analysis.

Depending on the configuration of the display and of the cavity filter and depending on the selection of wavelengths, only a small portion of the display and, therefore, only a small portion of the sensors is utilized for capturing an image within the framework of the second use so that possibly only a portion of the fingerprint is recorded instead of the whole fingerprint. This may lead to problems in verifying fingerprints if a complete match with the fingerprint must be made. Therefore, in order to improve the accuracy of detection, it is advantageous to use the largest possible portion of the display screen for capturing the first image as well as for capturing the second image. This can be achieved, for example, with the two possibilities described in the following.

In a first variant, in order to scan the largest possible portion of the placement surface the area illuminated from below is successively displaced after the first image and second image have been captured so that the first set of display pixels and the second set of display pixels are also displaced. Additional first and second images are than captured. The first image and the further first images are combined to form a first aggregate image, and the second image and further second images are combined to form a second aggregate image. In this way, a large contiguous area of the placement surface can be achieved for each of the aggregate images and, if the finger is not positioned too unfavorably, for example, at the edge of the display, a complete fingerprint or a complete recording of the fake can also be captured.

In a second variant, display pixels of the first set of display pixels and display pixels of the second set of display pixels are distributed in a checkerboard manner. Allocation to the first set or second set of display pixels is carried out based on color filters with which the sensors are provided. The smallest unit is formed by an individual pixel which is provided with a color filter for the one wavelength and is adjoined on either side by a pixel which is provided with a color filter for the other wavelength. In this way and given sufficiently high pixel density, a fingerprint can still be detected within the required accuracy. Of course, it is also possible to combine a plurality of pixels in a group, for example, in groups of 4×4 or 8×8 pixels, provided the required accuracy is still achieved. Each of these groups can then be provided with a shared filter. The time delay which results in the first possibility of use because the area illuminated from below is displaced in order to capture a plurality of images does not occur in the procedure described here. This speeds up the process. Also, in this second use, it is possible to capture and compare in more than two overall images per angular range with different colors.

In order to achieve a clear separation of the images, particularly in the second possibility of use, it is advantageous when the first angular range and the second angular range have an empty intersection, i.e., do not overlap.

For detecting fakes, it is particularly advantageous when the second angular range includes angles around and close to the angle of total internal reflection at the placement surface, for example, up to 5° or 10° around this limiting angle. In this case, the detection of forgeries is particularly easy because, when the principle of frustrated total internal reflection is used, the differences in intensity between the image of a positioned finger and the image of a fake are particularly apparent. Insofar as there are one or more air layers between the placement surface and the sensor layer, the second angular range includes angles which are smaller than the angle of total internal reflection at the respective interface with air but also preferably close to this angle, since the total internal reflection for light which impinges on the interface at angles greater than the limiting angle of total internal reflection prevents this light from being transmitted to the sensor pixels. On the other hand, if there is no air layer between the sensor pixels or sensor layer and the placement surface, i.e., all of the layers are interconnected, for example, through optical bonding, angles are preferably used which are greater than the limiting angle of total internal reflection at the placement surface.

The angular ranges are given by the utilized wavelength and the characteristics of the utilized cavity filter. A good separation of the two angular ranges can be achieved, for example, when the first wavelength is selected from a first wavelength range between 500 nm and 550 nm, preferably 550 nm, while the second wavelength is selected from a second wavelength range between 450 nm and 480 nm, preferably 460 nm. The first wavelength is then selected from the green wavelength region and the second wavelength is selected from the blue wavelength region. An alternative possibility provides that the first wavelength is selected from a first wavelength range between 600 nm and 650 nm, and the second wavelength is selected from a second wavelength range between 500 nm and 550 nm. For the recording of fingerprints, it is generally also possible to use wavelengths from the non-visible region of light, i.e., below 480 nm and above 780 nm. This has the advantage that a user is more or less unaware of the fingerprint recording.

The angular ranges can also be explicitly predetermined, and the wavelengths can then be selected depending on the cavity filter such that they satisfy this condition. Advantageously, the first angular range is between 0° and 15°, preferably between 0° and 10°. The second angular range is then preferably between 30° and the limiting angle of total internal reflection—approximately 41° in case of glass—in case there is an air layer between the pixel layer and the placement surface which blocks the transmission of rays with a greater angle by total internal reflection. If this is not the case, angles which are at most 5° greater than the limiting angle of total internal reflection at the placement surface are preferred.

Other characteristics can be used as image characteristics instead of or in addition to intensity, for example, characteristics calculated from intensity. In particular, the latter are spatial structures or latent prints of an autopodium.

It is understood that the features mentioned above and those yet to be explained below can be used not only in the stated combinations, but also in other combinations or alone, without departing from the scope of the present invention.

BRIEF DESCRIPTION OF THE DRAWINGS

The invention will be described in the following referring to exemplary embodiments in the appended drawings which likewise disclose features essential to the invention. These exemplary embodiments are to be considered as merely illustrative and not restrictive. For example, it is not to be construed from a description of an embodiment example having a plurality of elements or components that all of these elements or components are necessary for its implementation. On the contrary, other embodiment examples may also contain alternative elements and components, fewer elements or components, or additional elements or components. Elements or components of various embodiment examples may be combined with one another unless otherwise indicated. Modifications and alterations which are described for one of the embodiment examples may also be applicable to other embodiment examples. To avoid repetition, like or similar elements are designated by like reference numerals in various figures and are not described multiple times. The drawings show.

DETAILED DESCRIPTION OF THE DRAWINGS

Figure 1A:
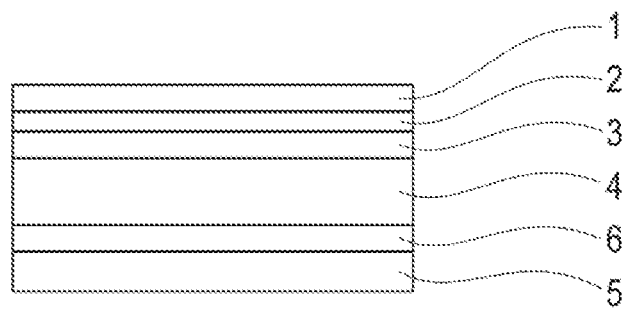
FIGS. 1a-1d various basic possibilities for the construction of a device for displaying information and for the simultaneous contact-based capture of impressions of a plurality of blood-perfused autopodia.
Figure 1B:
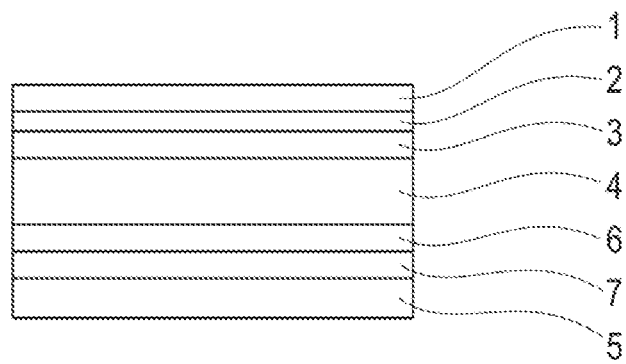
Figure 1C:
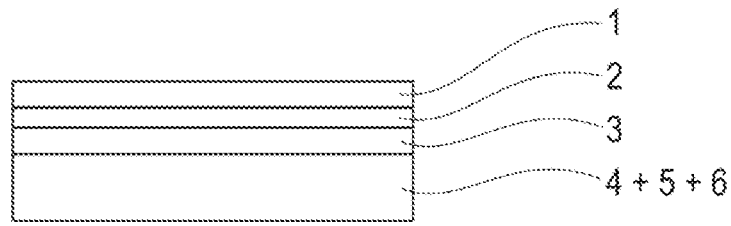

FIGS. 1a to 1c show various basic constructions of a device for displaying information on the one hand and for the simultaneous contact-based capture of impressions of a plurality of blood-perfused skin regions of human autopodia on the other hand. All three constructions have a few key components in common: from the point of view of an observer or from direction of a finger to be placed thereon, this device comprises a placement surface 1 on which the autopodia are placed and under which a protective layer 2 is arranged. The placement surface 1 can also form the surface of the protective layer 2. The thicknesses and thickness ratios shown here are not actual and are only illustrative of the individual components. A touchpad 3 is arranged under the protective layer 2. In mobile devices such as smartphones, the touchpad 3 is used for entering control commands with one or more fingers. Further, it detects whether or not a finger is placed on the placement surface 1. However, the touchpad 3 is not compulsorily necessary for the functioning of the device. It can also be determined in some other way, for example, by means of the sensor pixels described in the following, whether or not a finger is placed on the placement surface 1. A display unit 4 is arranged under the touchpad 3 viewed from direction of the contacting skin region. The display unit 4 has at least partially transparent display elements with display pixels emitting light in direction of the placement surface 1, these display elements being arranged in grid form and individually controllable by means of a control unit, not shown here.

Further, all three configurations comprise optical sensor pixels which detect light that is incident on the sensor pixels from direction of the placement surface 1. In a first alternative, the sensor pixels are arranged in a sensor layer 5 which is arranged under the display unit 4 viewed from the direction of the contacting skin region. This is the case in the devices shown in FIG. 1a and FIG. 1b. In a second alternative, the sensor pixels are arranged in the display unit 4 between the display elements. This configuration is shown in FIG. 1c. Means for angle selection which comprise at least one cavity filter are arranged upstream of the optical sensor pixels in direction of the placement surface 1. In the configuration shown in FIG. 1a and FIG. 1b, the optical sensor pixels are arranged in a sensor layer 5 below the display unit 4. The at least one cavity filter is formed as a cavity filter layer 6 arranged between the display unit 4 and the sensor layer 5. In the configuration shown in FIG. 1c, in which the optical sensor pixels are arranged between the display elements in the display unit 4, one or more pixel-shaped cavity filters are associated with each sensor pixel and arranged above the respective sensor pixel. With thicker cover glasses, it is recommended that a pixel-based shutter structure 7 be inserted between the cavity filter layer 6 and the sensor layer 5, as a result of which the angular range transmitted by the cavity filter can be further limited.

Figure 1D:
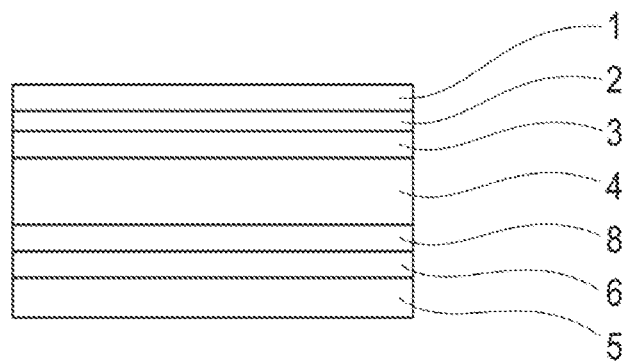

The display unit 4 can essentially be configured in two different ways. In a first configuration, the display unit 4 comprises actively luminous display pixels and is preferably configured as an LED unit. The display pixels can be formed as LEDs, OLEDs, QLEDs or microLEDs. As has already been mentioned, the display unit 4 is partially transparent to light coming from the placement surface 1. In a second configuration, the display unit 4 comprises passively illuminated display pixels and is configured, for example, as an LC unit with display pixels formed as LC elements. This is shown in FIG. 1d. A first illumination unit with a transparent light guide layer body 8 and first illuminants is provided for illumination. The light guide layer body 8 is arranged below the display unit 4 and above the cavity filter layer 6 viewed from the placement surface 1. The first illuminants can be arranged laterally, for example, and the light thereof can be coupled into the light guide layer body 8 from where it diffusely illuminates the display pixels in a first wavelength region with corresponding out-coupling structures or scattering elements.

Figure 2:
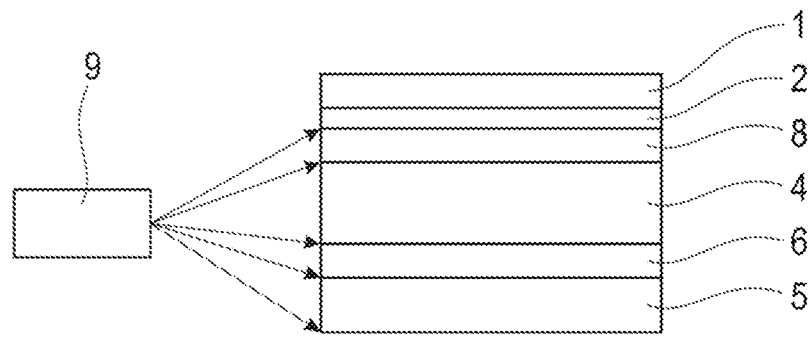
FIG. 2 a schematic diagram of a device with additional illumination.

Regardless of whether or not a first illumination unit is provided for illuminating the passively illuminated display pixels, the device can comprise a second illumination unit 9 with second illuminants as is shown schematically in FIG. 2. As indicated by the arrows in FIG. 2, the second illumination unit 9 which can likewise comprise a light guide layer body can be integrated at different locations in the layer stack of the device. The second illuminants are formed for emitting directed light of a determined wavelength in a limited angular range of no more than 20° around a predetermined central direction. The central direction is determined depending on the predetermined wavelength of the directed light and on an angle selectivity of the at least one cavity filter for the predetermined wavelength. The central direction preferably lies parallel to a normal of the placement surface 1. In this way, an improved image quality can be achieved for capturing fingerprints because the intensity arriving at the optical sensors is increased. A further advantage of the second illumination unit is that it can be switched independently from the display screen. It can be variably adapted to different situations, for example, skin color, ambient light or moisture of the skin and/or of the placement surface 1 for capturing fingerprints. The normal output on the display screen is not influenced in this way. With a corresponding configuration of the cavity filter, invisible light—for example, near infrared or near ultraviolet—in particular can also be used for capturing fingerprints. In this way, negative visual effects on the display screen resulting from fingerprint recording are prevented.

Figure 3A:
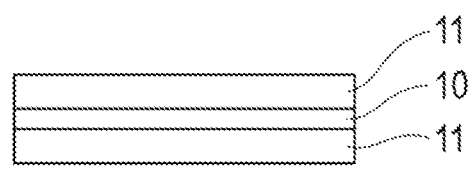
FIGS. 3a-3c the basic construction of cavity filters.
Figure 3B:
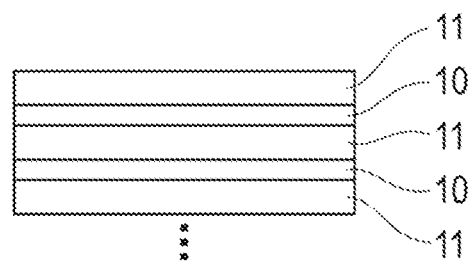

The configuration and action of a cavity filter will be described in the following referring to FIGS. 3 to 5. FIG. 3a shows the basic construction of a cavity filter which is a special type of interference filter. A cavity layer 10 with the approximate optical thickness on the order of the light wavelength to be transmitted, that is, with which the cavity filter is resonant, is embedded between two reflector layers 11. By inserting the cavity layer 10, cavity modes are formed which allow light in this wavelength range or band to pass through the reflector layers 11. The thickness of the cavity layers 10 can be controlled during production and is determined depending on a wavelength range to be transmitted for capturing impressions of a plurality of blood-perfused skin regions of human autopodia and on an angular range to be selected by the cavity layers 10 for this wavelength range. Further, it is also possible to variably adjust the thickness of the cavity layer 10, for example, by means of piezoelectric materials. In particular, the cavity filters can also be configured as dual-cavity filters or multi-cavity filters. The more cavity layers 10 the filter contains, the sharper the delimitation of the transmitted wavelength range from the shape of a Lorentz curve to a box shape. A dual-cavity filter is shown, for example, in FIG. 3b. The dots on the bottom indicate that further cavity filter layers may follow. The cavity filter layer 10 can be formed as a metal or a dielectric. In the case of a metal layer, for example, of aluminum, it has a thickness of approximately 100 nm. If a plurality of cavity layers 10 are used, an improved selection of the angular range to be selected can be determined.

Figure 3C:
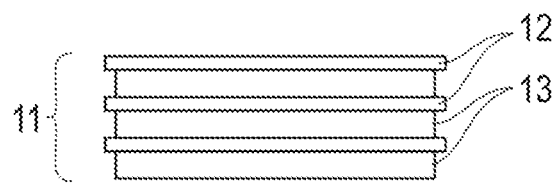

The construction of a reflector layer 11 is shown in detail in FIG. 3c. High-index layers 12 of a material with a high refractive index alternate with low-index layers 13. Each layer has the optical thickness of $n \times d = \lambda/4$, where n is the refractive index, d is the actual thickness, and $\lambda$ is the wavelength of the light which is to be transmitted and with which the cavity filter is accordingly resonant. The cavity layer 10 often has an optical thickness of $\lambda/2$. The reflector layers 11 can be formed as Bragg mirrors from alternating layers of two dielectrics or metals or combinations of dielectrics and metals. The advantage in using exclusively dielectric reflectors compared to metal reflectors consists in that the reflectivity is more than 99% higher and asymptomatically approaches 100% with an increasing quantity of layer pairs. Absorption is virtually nonexistent. When a metallic cavity layer 10 is used in addition, sidebands which occur in all-dielectric reflector layers and which can possibly lead to interference signals for the optical sensors can also be efficiently suppressed. Because of the high reflectivity, the cavity filters can be used to increase the luminous efficiency by predominantly reflecting light which, in case of active display pixels, is emitted by the latter or, in case of passive display pixels, is emitted by an illumination unit in direction of the sensor pixels.

For use in connection with fingerprint checking, an otherwise insignificant property of the cavity filter is utilized, namely, the capability of allowing the transmission of wavelengths only in particular angular ranges, i.e., an angle selection depending on wavelength. As will be explained in the following referring to FIG. 4 and FIG. 5, the use of cavity filters on the one hand allows the choice of a greater distance between the placement surface 1 and the optical sensor layer 5 so that the optical sensor layer 5 can easily be arranged as the bottommost layer of a display screen unit and, therefore, need not be transparent and does not negatively affect the imaging of the normal display. On the other hand, the detection of forgeries relating to fingerprints is facilitated.

A layer stack which is formed only of reflector layers 11 reflects any light substantially in an angular range from 0° to approximately 40° with respect to the normal of the surface. Inserting the cavity layer 10 between two reflector layers 11 at a resonant wavelength for which the cavity layer 10 is designed leads to an increased transmission through the reflector layers 11. Resonance exists when the light wave is in phase with the starting point after being reflected twice at the reflector layers 11 and after operation through the cavity layer 10. The spectral permittivity of the cavity mode shows a strong angular dependence and shifts to shorter wavelengths because of the altered phase length at oblique incident angles of the light. The displacement in dependence on the angle of incidence increases as the effective refractive index $n^*$ of the dielectric structure decreases. For a high-index cavity layer, the effective refractive index $n^*$ is given by $$n^* = \sqrt{(n_H n_L)} \qquad (1),$$

where $n_H$ is the refractive index of a reflector layer configured as high-index layer 12 and $n_L$ is the refractive index of a reflector layer configured as low-index layer 13, and for a low-index cavity layer is given by $$n^* = \frac{n_L}{\sqrt{1\frac{n_L}{n_H} + \left(\frac{n_L}{n_H}\right)^2}}, \quad (2)$$

where the angular dependence $\Delta\lambda(\theta_0)$ of the transmission can be described approximately by the term:

$$\frac{\Delta\lambda}{\lambda_0} = \frac{n_0\theta_0^2}{2n^{*2}}, \quad (3)$$

where $\theta_0$ is selected in radiants and no corresponds to the refractive index of the environment of the filter by which is meant the adjoining materials, typically glass in the present application. The same dielectric material as that used for the high-index or low-index reflector layers can be used for the high-index and low-index cavity layers so that at least two materials with different refractive indices are needed for the construction of a dielectric cavity filter.

Figure 4A:
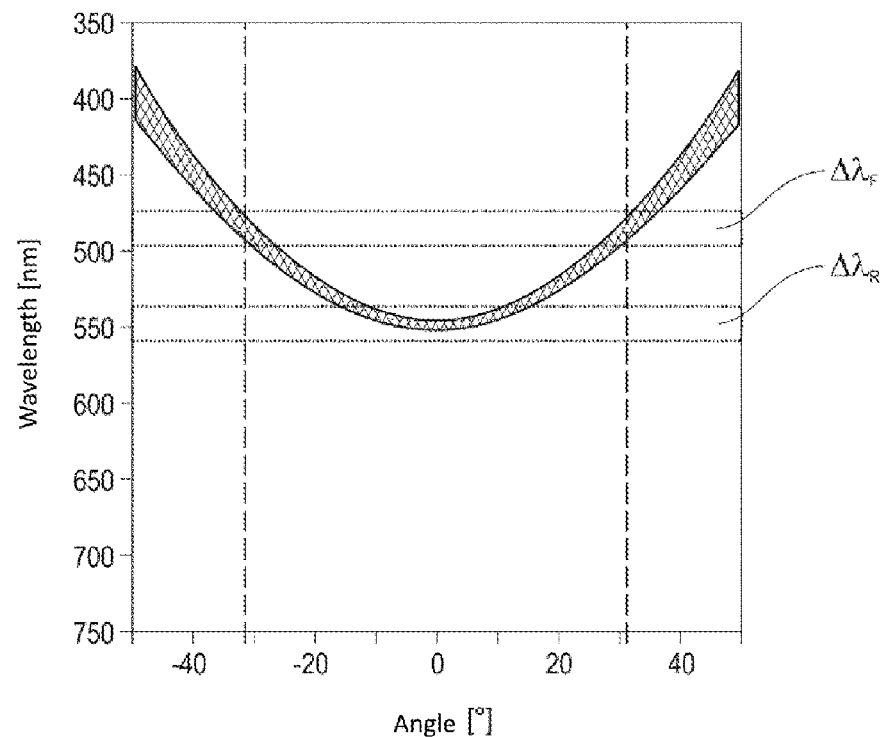
FIGS. 4a-c the angle selectivity of a cavity filter.
Figure 4B:
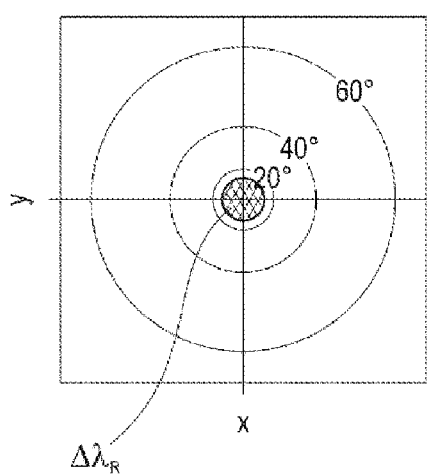
Figure 4C:
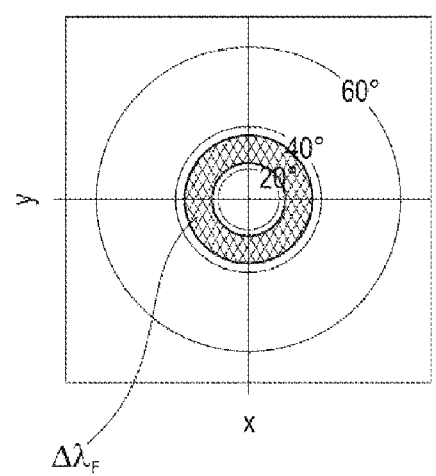
Figure 5:
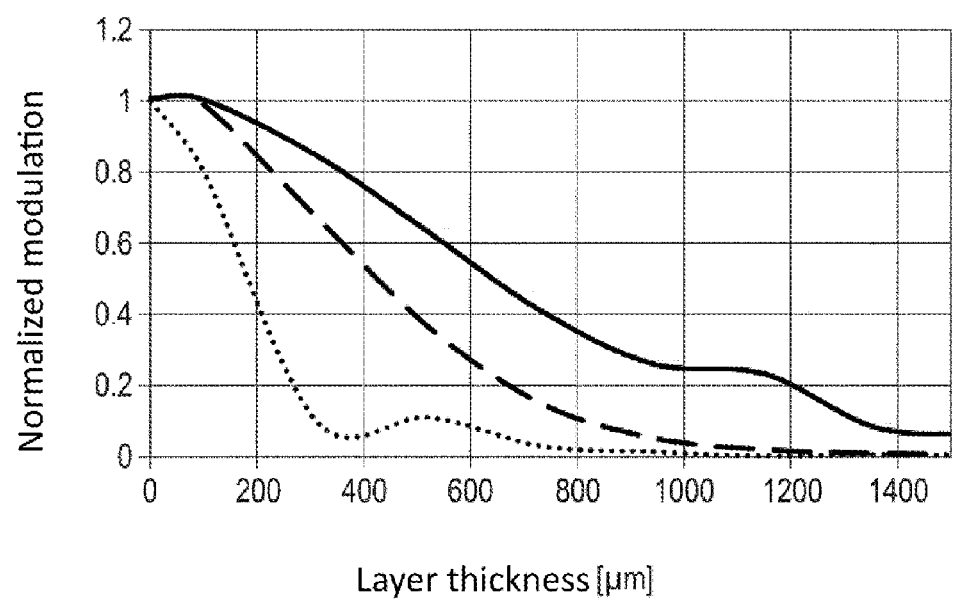
FIG. 5 the modulation transfer function of the device for 2.5 line pairs per millimeter depending on a cover layer thickness for using without a cavity filter and without a shutter (dotted line), with a cavity filter (dashed line) and with a cavity filter and additional shutter (solid line)

The angular dependence $\Delta\lambda(\theta_0)$ of the transmission of a cavity filter is shown by way of example in FIG. 4a. In the example shown here, the cavity filter is transmissive in the shaded area and has a resonant wavelength range $\Delta\lambda_R$ at approximately 550 nm. For this wavelength, it is transmissive in a narrow conical angular range of 0° to approximately 15° as is shown in FIG. 4b. The shaded region corresponds to the transmission range for the resonant wavelength range. Since the cavity filter layer 6 is arranged directly above the sensor layer 5, the angular range for the light which is detected in the optical sensor layer 5 can be sharply limited. For light sources which only emit in a narrow spectral band or even only emit monochromatic light the angular range which is detected by the optical sensors can be limited to approximately 10° around the surface normal of the placement surface 1. The point spread function PSF is also correspondingly reduced. This in turn has an effect on the modulation transfer function MTF which corresponds to the amount of the Fourier transform of the PSF. The MTF is a measurement of the dependence of normalized modulation on spatial frequency and can be utilized to determine the spatial resolution of a predetermined configuration. In particular, a maximum distance of the optical sensor layer 5 from the placement surface 1 beyond which fingerprints can no longer be resolved can be determined in this way. This matters in the conception of display screens for mobile devices which are to be capable of identifying fingerprints and, therefore, so as not to impair the image quality of contents to be displayed on the image screen because the sensor layer is to be arranged as the bottommost layer. Because of their position as bottommost layer, the sensors need not be transparent or semitransparent and do not pass any display illumination. Accordingly, the requirements for the optical sensor are looser, and less expensive sensors such as, for example, CMOS-based sensors or organic photodiodes, can be used instead of, e.g., TFT-based sensors on glass substrates.

For the human fingerprint, a period length of approximately 400 µm is measured from ridge to ridge, which corresponds to a spatial frequency of k=2.5 line pairs per millimeter. The point spread function which is given by the reflection of a typical display illumination—i.e., without the use of a cavity filter—on the placement surface 1 yields the curve—shown by a dotted line in FIG. 5—of the normalized modulation depending on the cover layer thickness, i.e., the thickness of all of the material layers located between the placement surface 1 and the sensor layer 5. It has been shown that the modulation approximates zero above 300 µm, which makes fingerprints no longer clearly detectable. If a resonant cavity filter is introduced which realizes an angle selection in the range of the resonant wavelength to angles of less than 10° relative to the surface normal, the curve shown in a dashed line results for the normalized modulation. Distinct contrasts are also still measured at cover layer thicknesses above 800 µm. When pixel shutters are additionally arranged for the optical sensor pixels as will be described below referring to FIG. 6, the curve of the normalized modulation shown by the solid line results, i.e., the possible cover layer thickness can be further increased by a factor of 2 so that distinct contrasts can still be measured with the additional shutter and the cavity filter even with cover layer thicknesses greater than 1 mm.

Figure 6:
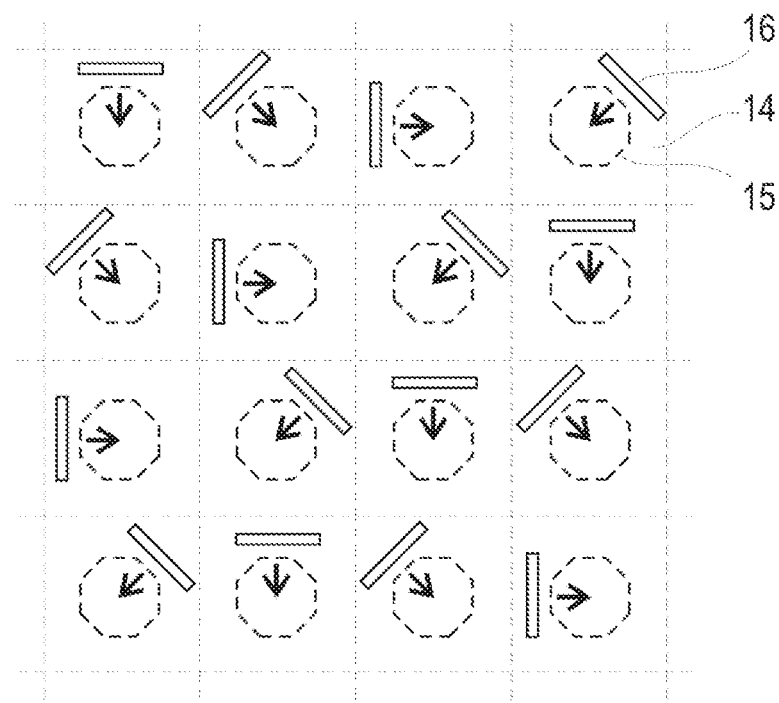
FIG. 6 an array with optical sensors and additional shutters.
Figure 7:
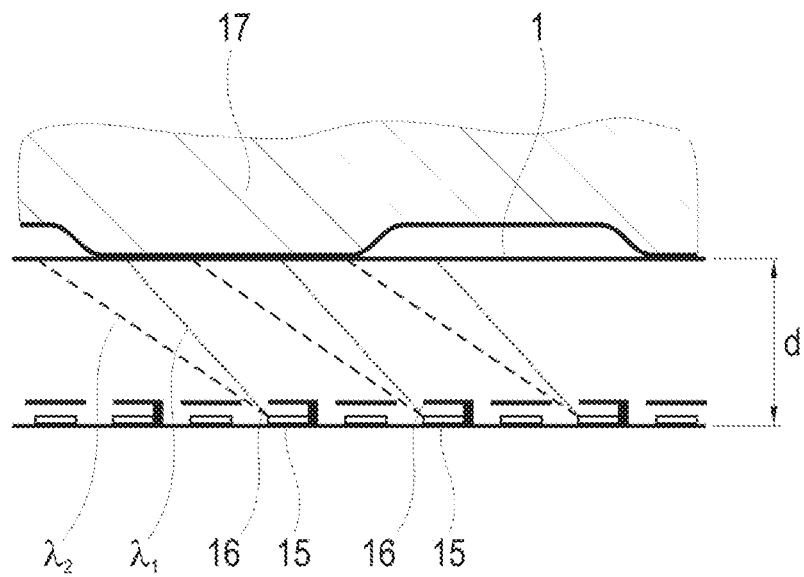
FIG. 7 the effect of the additional shutters using two colors for increasing the spatial resolution.

By using the additional shutter structure as shown in FIG. 6, the angular range can be limited even more and the spatial resolution can therefore be increased. The limiting is carried out in that the shutter structure—referring to the spherical angular space—only passes angles from one half of the upper hemisphere; the lower hemisphere would correspond to illumination from below. The array of sensor pixels 14 is shown. A detection area 15 is arranged in each sensor pixel. Each sensor pixel 14 is provided with a shutter 16 so that, for each pixel, light can impinge on the pixel only from the direction of the respective arrow shown in the drawing so that the spread of the angular spectrum can be halved, which makes it possible to double the cover layer thickness. Further, the shutters 16 cover the detection areas 15 almost completely in the direction of the arrows. In order to compensate for the generation of an asymmetrical MTF, the shutters 16 are arranged in an alternating manner as is shown in FIG. 6. However, the maximum possible measureable spatial frequency, or Nyquist frequency as it is called, is at least halved in this way. In order to mitigate or circumvent this limitation, the cavity filter or the angle selectivity of the cavity filter must be configured in such a way that recordings with at least two colors $\lambda_1$, $\lambda_2$ can be detected, where a zone can be scanned on the placement surface for one color $\lambda_1$ that is not scanned for the other color $\lambda_2$. This relationship is shown in FIG. 7. In this instance, d designates the total cover layer thickness between the sensor layer and the placement surface 1 on which—in this instance—one finger 17 is placed. In order to make this increased scanning possible, illumination must be carried out sequentially in case of a monochromatic optical sensor and two images must be captured. This restriction is omitted for color sensors, but the color sensor pixels are usually arranged in an alternating manner in this instance or correspondingly determined patterns so that the Nyquist frequency is lower from the outset.

Because of the angle selectivity of the cavity filter, it is possible to configure the cavity filter in such a way that recordings can be made in two colors. However, it must be taken into account that the cavity filter is transparent to light of this second color in a different angular range, which is also a precondition for scanning two different zones on the placement surface with light of two colors. The different angle selectivity for different colors is also explained referring to FIG. 4a. A further wavelength range $\Delta\lambda_F$ around a second wavelength $\lambda_F$ is labelled above the wavelength range $\Delta\lambda_R$ around the resonant wavelength. This second wavelength $\lambda_F$ is shorter than the resonant wavelength and, in the example, resides in the blue region at about 460 nm, whereas the resonant wavelength resides in the green region at about 550 nm. For this further wavelength range, the cavity filter is only transparent in an angular range between approximately 25° and 40°, i.e., does not overlap with the angular range for which the cavity filter is transparent in the resonant wavelength. This can be utilized for detecting fake fingerprints as will be explained below referring to FIGS. 8 to 11.

The device described above can be used to differentiate between an object (finger) placed on the placement surface 1 and a forgery of a fingerprint. A first method for detecting fakes is described referring to FIG. 8. A precondition for the flow of the process is the placing of an object—either the finger or the forgery—in a step 210. In the next step 220, the device detects—for example, by means of a touchpad—that an object is placed thereon. In a step 230, the optical sensor pixels in the sensor layer 5 are switched to detect light. In step 240, the display pixels of the display unit 4 are switched such that they emit light of at least a first wavelength $\lambda_R$ which corresponds to a central wavelength of the at least one cavity filter. The cavity filter is resonant with light of this first wavelength $\lambda_R$ and is transparent in a first angular range around a direction perpendicular to the placement surface 1. In a subsequent step 250, a first overall image is captured by means of the sensor pixels. In the next step 260, the display pixels are switched such that they emit light of a second wavelength $\lambda_F$ which is shorter than the first wavelength $\lambda_R$. The cavity filter is transparent to light of the second wavelength $\lambda_F$ in a second angular range, which second angular range cuts out a cone around the direction perpendicular to the placement surface 1. In particular, the first angular range and the second angular range can have an empty intersection. In the subsequent step 270, a second overall image is captured by means of the sensor pixels. There follows a step 280 in which the first overall image and second overall image are compared with respect to differences in the image characteristics thereof. In particular, intensity or characteristics calculated from intensity, for example, a spatial structure or a latent print of a finger, can be used as image characteristics. The result is queried in a step 290. If the authenticity of the fingerprint is confirmed, the display screen can be cleared for further input, for example, in step 291. If a fake is detected, this can be indicated, e.g., in step 292, and the mobile device can be locked against further input. Steps 291 and 292 serve only as examples; further functions—in particular those connected to the enabling of actions—can be associated with step 291 and subsequent steps.

For the detection of forgeries, it is advantageous when the second angular range for the second wavelength $\lambda_F$ includes angles which are smaller than the angle of total internal reflection at the placement surface 1, since no light can be transmitted at angles >42° by many displays because of an integrated air layer due to total internal reflection at the interface. When an actual finger is placed on the placement surface 1, the differences between the first overall image and the second overall image are clear. While the first wavelength $\lambda_R$ can be used for imaging the fingerprint in the first overall image, the detected signal decreases significantly during illumination with the second wavelength $\lambda_F$ because the total internal reflection is frustrated or significant portions of light are also coupled out at angles close to total internal reflection. In contrast, there is no drop in intensity detectable in a forgery when illuminated with the second wavelength λF.

Of course, it is also possible to capture and compare more than two overall images per angular range, and all of the overall images are captured with different colors. This increases the accuracy in determining whether or not a forgery is present.

Since a plurality of images must be captured sequentially in the method described above, this could possibly be perceived as a disadvantage by users of a mobile device. In order to accelerate the detection of forgeries, the method described above can be somewhat modified and a plurality of images can then be captured simultaneously. This will be explained in the following referring to FIG. 9. Method steps which are identical to the method described above and in FIG. 8 have the same reference numerals and will not be explained again. In contrast to the method described above, not all of the display pixels are switched in the same way after the optical sensor pixels for detecting light have been switched on in step 230; rather, in step 340 a first set of display pixels is switched in such a way that the first set of display pixels emits light of the first wavelength $\lambda_R$, and in step 350, which can be executed simultaneous with step 340, a second set of display pixels is switched in such a way that the second set of display pixels emits light of the second wavelength $\lambda_F$. The conditions for the first wavelength $\lambda_R$ and the second wavelength $\lambda_F$ are the same as those described above as relates to their tuning with respect to the cavity filter and the first and second angular ranges. However, the positions of the first set of display pixels and of the second set of display pixels in the display unit 4 are so determined, depending on the first wavelength $\lambda_R$, the second wavelength $\lambda_F$ and the respective selective angular range, that, on the one hand, the light emitted by the first set of display pixels and second set of display pixels illuminates the same area of the placement surface 1 from below and, on the other hand, light of the first wavelength $\lambda_R$ which is incident on the sensor pixels from the direction of the placement surface 1 is detected by means of a first set of sensor pixels and is captured as first image in step 360, and light of the second wavelength $\lambda_F$ which is incident on the sensor pixels from direction of the placement surface 1 is detected by a second set of sensor pixels and is captured simultaneously in step 360 as second image. In step 83, the first image and second image are analyzed with respect to differences in their image characteristics before executing further steps which depend on a result of the analysis. These further steps correspond to those which were described in connection with FIG. 8.

Figure 8:
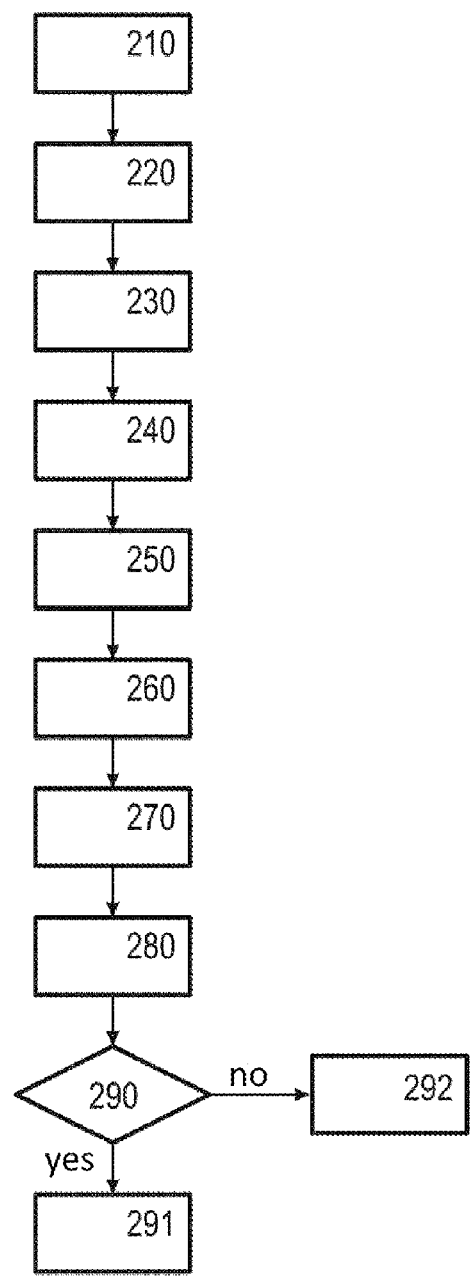
FIG. 8 a flowchart for a first method for using the device.
Figure 9:
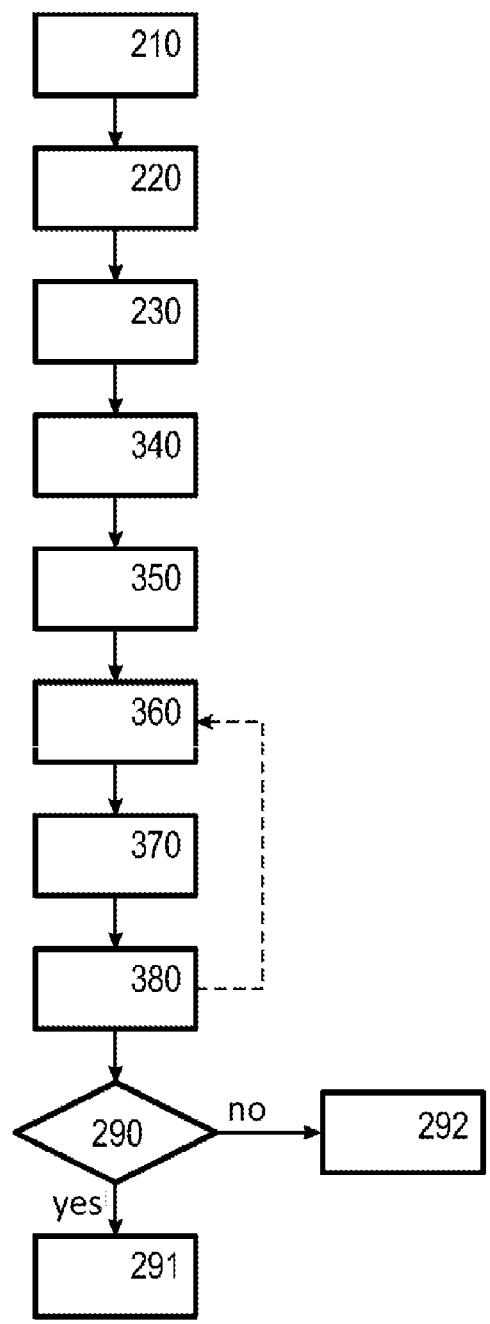
FIG. 9 a flowchart for a second method for using the device.
Figure 10:
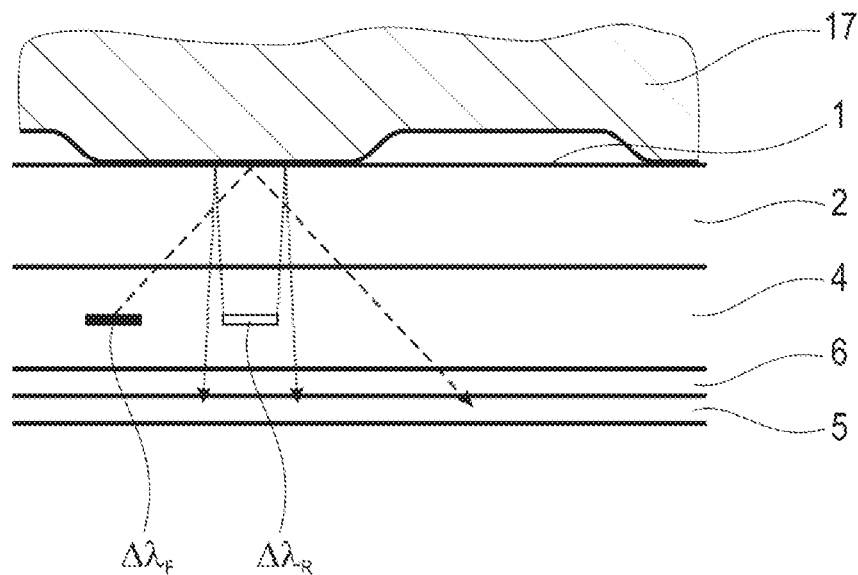
FIG. 10 a detail of the beam path for two different wavelengths.

In contrast to the method shown in FIG. 8, no overall images are captured in the method shown in FIG. 9 but rather only images showing a section of the total placement surface 1. This has to do with the fact that, while the same area of the placement surface 1 is illuminated by both wavelengths, this area is detected by means of different sensor pixels so that twice as many sensor pixels are needed for capturing a section compared to the first method described with reference to FIG. 8, since different sensor pixels as well as different display pixels are required for illumination and detection with the two wavelengths. This will be described in the following referring to FIG. 10 and FIG. 11. FIG. 10 shows the basic illumination conditions. Light of the resonant wavelength $\lambda_R$ is emitted by a first pixel in the display unit 4 as shown by the dotted line. The emission is effected in all possible angles, but only light which impinges on the cavity filter in the narrow angular range around the surface normal of the placement surface 1 as symbolized by the dotted arrows is passed through to the sensor pixels in the sensor layer 5 because of the cavity filter layer 6. A further pixel in the display unit 4 emits light of the second wavelength represented here by the dashed line. This light is also emitted in all possible angles, but only light in the second angular range is allowed by the cavity filter layer 6 to pass through to the sensor layer 5 as symbolized by the dashed-line arrows. Accordingly, one and the same point on the placement surface 1 can be simultaneously scanned with different colors and detected at different places on the sensor. The regions of the sensor layer 5 which correlate with a location on the placement surface 1 depend on the cover layer thickness between sensor layer 5 and placement surface 1 and on the distance between the display pixels and the placement surface 1. Small groups of adjacent display pixels can also be switched together and used together for illumination so that the amount of light detectable on the sensor is increased. The signal can then be averaged, for example, provided there is no overlapping of the reflections of the different light colors on the sensor layer or sensor pixels.

Figure 11:
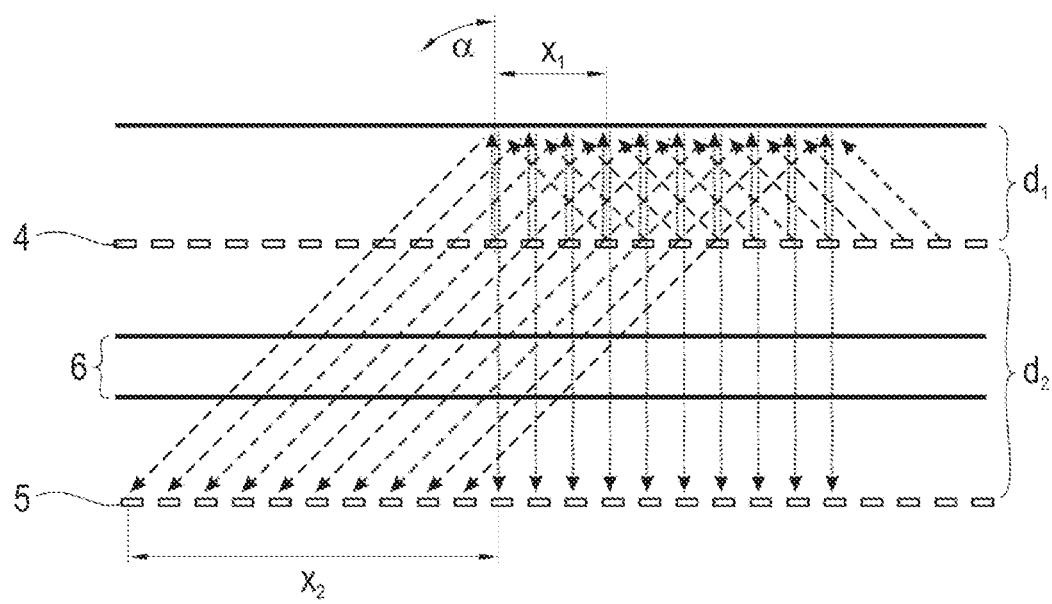
FIG. 11 an overview of the working principle of the second method.

FIG. 11 illustrates this procedure once again for a larger area of the device. In this instance, the display unit 4 is symbolized by its display pixels and the sensor layer 5 is symbolized by its sensor pixels. Relatively large surface areas of the placement surface 1 can be captured in this way, the display unit being controlled in such a way that every sensor pixel can detect, at most, only light of a single color. This rules out an overlapping of colors, and more information can be received from one and the same object point on different sensor pixels. The size $x_2$ of the area depends on the distance $d_1$ between the display unit 4 and the placement surface 1, the distance $d_2$ between the sensor layer 5 and the display unit 4 and the angular range for which the cavity filter or cavity filter layer 6 is transparent to the second wavelength $\lambda_F$. In order to scan the largest possible portion of the placement surface 1, the area illuminated from below can also be successively displaced after the first image and second image have been captured, as a result of which the first set of display pixels and second set of display pixels are also displaced. Further images are then captured and are combined to form a first aggregate image and a second aggregate image. This is indicated by the dashed arrow in FIG. 9. Alternatively, the display pixels of the first set of display pixels and the display pixels of the second set of display pixels can be distributed in a checkboard manner, and allocation to the first set of display pixels or second set of display pixels is carried out based on color filters or by means of a corresponding control.

Another possibility for circumventing sequential recordings is to use color sensors which only detect light for determined spectral ranges instead of expensive monochromatic optical sensors. The optical sensor pixels then comprise different color sensor pixels which are alternately arranged in columns and rows in which the sensor pixels are arranged. If the color to be detected is adapted to the transparent region of the cavity filter, a plurality of overall images can be imaged in a recording and evaluated.

The comparison of image characteristics after the images have been captured can be used not only to detect forged fingerprints but also, for example, to achieve an increased resolution and compensate for sensor defects or other errors in the image recording by means of superimposing the images or overall images.

As has already been mentioned, the cavity filter can be designed for a plurality of different angular ranges and wavelength ranges, which should preferably be selected in such a way that the wavelengths are far enough apart to exclude an overlapping of angular ranges.

By means of the device described above and the method described above, an authentication of multiple fingers, for example, can be integrated in mobile telephones without impairing the quality of the display of information on the display screen. Also, almost the entire surface of the device is available for displaying information because the entire surface of the display screen can be used for detecting the fingerprint and no area need be reserved exclusively for detecting prints. The detection of fingerprints is carried out inconspicuously and is hardly noticed by the user. Integration in thicker display screens is also possible through the use of cavity filters.

REFERENCE NUMERALS

1 placement surface
2 protective layer
3 touchpad
4 display unit
5 sensor layer
6 cavity filter layer
7 shutter structure
8 light guide layer body
9 second illumination unit
10 cavity layer
11 reflector layers
12 high-index layer
13 low-index layer
14 sensor pixel
15 detection area
16 shutter/additional shutter
17 finger

The invention claimed is:

1. A device for displaying information and for contact-based, simultaneous capture of impressions of a plurality of blood-perfused skin regions of human autopodia, comprising a placement surface for placing the autopodia, a display unit which is arranged below the placement surface viewed from a direction of a contacting skin region and which has at least partially transparent display elements which are arranged in grid form and are individually controllable by a control unit, the display elements having display pixels which emit light in a direction of the placement surface, optical sensor pixels which detect light incident on the sensor pixels from a direction of the placement surface, and i. the sensor pixels are arranged in a sensor layer arranged under the display unit as viewed from the direction of the contacting skin region, or ii the sensor pixels are arranged in the display unit between the display elements, at least one cavity filter for angle selection, arranged in front of the optical sensor pixels in a direction of the placement surface, wherein the at least one cavity filter is formed as one or more individual cavity filters, one or more dual-cavity filters or one or more multi-cavity filters, and as layer stacks with plane reflector layers and plane cavity layers separating the reflector layers, wherein the layers are arranged parallel to the placement surface, and a thickness of the cavity layers is determined depending on a wavelength range to be transmitted for capturing impressions of the plurality of blood-perfused skin regions of human autopodia and on an angular range to be selected by the cavity layers for this wavelength range.

2. The device according to claim 1, in which the optical sensor pixels are arranged in the display unit between the display elements, wherein one or more pixelated or pixel-shaped cavity filters are associated with each sensor pixel and arranged above the respective sensor pixel.

3. The device according to claim 1, in which the optical sensor pixels are arranged in a sensor layer below the display unit, wherein the at least one cavity filter is formed as a cavity filter layer which is arranged between the display unit and the sensor layer.

4. The device according to claim 1, wherein the display unit comprises actively luminous display pixels, wherein the display unit is configured as an LED unit with display pixels which are formed as LEDs, OLEDs, QLEDs or microLEDs.

5. The device according to claim 4, comprising a second illumination unit with second illuminants which are formed for emitting directed light of a predetermined wavelength in a limited angular range of not more than 20° around a predetermined central direction, wherein the central direction is determined depending on the predetermined wavelength of the directed light and on an angle selectivity of the at least one cavity filter for the predetermined wavelength, parallel to a normal of the placement surface.

6. The device according to claim 1, wherein the display unit comprises passively illuminated display pixels, and a first illumination unit with a transparent light guide layer body and first illuminants is arranged below the display unit and above the at least one cavity filter viewed from the placement surface, and the display pixels are diffusely illuminated by the light guide layer body in a first wavelength range.

7. The device according to claim 6, wherein the display unit is configured as an LC unit with display pixels formed as LC elements.

8. The device according to claim 1, wherein the thickness of the at least one cavity layer is variably adjustable by piezoelectric materials.

9. The device according to claim 1, wherein the reflector layers are configured as Bragg mirrors comprising alternating layers of two dielectrics or a metal.

10. The device according to claim 1, wherein the at least one cavity layer between the reflector layers is metallic or dielectric, wherein, when there is more than one cavity layer, metallic and dielectric layers are combinable for an improved selection of the angular range to be selected.

11. The device according to claim 1, wherein the cavity filter or the cavity filters predominantly reflect light which, in case of active display pixels, is emitted by the latter or which, in case of passive display pixels, is emitted by an illumination unit in a direction of the sensor pixels in order to increase the luminous efficiency.

12. The device according to claim 1, wherein each of the sensor pixels is provided with an additional shutter, which reduces the selected angular range, wherein the additional shutters are alternately arranged along rows and columns in which the sensor pixels are arranged.

13. The device according to claim 1, wherein the optical sensor pixels comprise different color sensor pixels which are alternately arranged in columns and rows in which the sensor pixels are arranged.

14. A method of using the device according to claim 1 for distinguishing whether an object placed on the placement surface is an autopodium or a forgery of an impression of an autopodium, wherein the at least one cavity filter is constructed as a layer stack comprising planar reflector layers and planar cavity layers separating the reflector layers, which reflector layers and cavity layers are arranged parallel to the placement surface, comprising:

placing an object on the placement surface
switching the optical sensor pixels on to detect light,
switching the display pixels in such a way that the display pixels emit light of at least a first wavelength $\lambda_R$ which corresponds to a central wavelength of the at least one cavity filter, wherein the cavity filter is resonant with light of this first wavelength $\lambda_R$ and is transparent in a first angular range around a direction perpendicular to the placement surface,
capturing a first overall image using the sensor pixels,
switching the display pixels such that the display pixels emit light of a second wavelength $\lambda_F$ which is shorter than the first wavelength $\lambda_R$, and wherein the cavity filter is transparent to light of the second wavelength $\lambda_F$ in a second angular range, wherein the second angular range cuts out a cone or conical ring around the direction perpendicular to the placement surface,
capturing a second overall image using the sensor pixels,
analyzing the first overall image and second overall image with respect to differences in their image characteristics.

15. The method according to claim 14, wherein the first angular range and the second angular range have an empty intersection.

16. The method according to claim 14, wherein the second angular range includes angles around and close to the angle of total internal reflection at the placement surface.

17. The method according to claim 14, wherein the first wavelength $\lambda_R$ is selected from a first wavelength range between 500 nm and 550 nm, while the second wavelength $\lambda_F$ is selected from a second wavelength range between 450 nm and 480 nm, or the first wavelength $\lambda_R$ is selected from a first wavelength range between 600 nm and 650 nm, and the second wavelength $\lambda_F$ is selected from a second wavelength range between 500 nm and 550 nm.

18. The method according to claim 14, wherein the first angular range is selected between 0° and 15° and the second angular range is selected between 30° and an angle which is at most 5° greater than a limiting angle of total internal reflection at the placement surface.

19. The method according to claim 14, wherein more than two overall images are captured and compared for each angular range, wherein all of the overall images are captured with different colors.

20. The method according to claim 14, wherein the intensity or characteristics calculated from intensity, preferably a spatial structure or a latent impression of an autopodium, are used as image characteristics.

21. The method according to claim 14, wherein, as further steps, a comparison of the intensity ratios of the at least two images or overall images with a calibrated threshold range is carried out for detecting forged prints, and/or all of the images or overall images are superposed in order to achieve increased resolution or compensate for sensor defects and other errors in the image recording, and/or when an authorized fingerprint is detected one or more functions are enabled in an appliance in which the device is implemented, and/or the appliance is locked when a forged fingerprint is detected.

22. A method of using the device according to claim 1 for distinguishing whether an object placed on the placement surface is an autopodium or a forgery of an impression of an autopodium, wherein the at least one cavity filter is constructed as a layer stack comprising planar reflector layers and planar cavity layers separating the reflector layers, which reflector layers and cavity layers are arranged parallel to the placement surface, comprising:

placing an object on the placement surface switching the optical sensor pixels on to detect light, switching a first set of display pixels in such a way that the first set of display pixels emits light of at least a first wavelength $\lambda_R$ which corresponds to a central wavelength of the at least one cavity filter, wherein the cavity filter is resonant with light of this first wavelength $\lambda_R$ and is selective in a first angular range around a direction perpendicular to the placement surface, switching a second set of display pixels in such a way that the second set of display pixels emits light of a second wavelength $\lambda_F$ which is shorter than the first wavelength, and wherein the cavity filter is selective for light of the second wavelength $\lambda_F$ in a second angular range, wherein the second angular range cuts out a cone or cone ring around the direction perpendicular to the placement surface, wherein positions of the first set of display pixels and of the second set of display pixels in the display unit are so determined depending on the first wavelength $\lambda_R$ and second wavelength $\lambda_F$ and the respective selective angular ranges that, on the one hand, the light emitted by the first set of display pixels and by the second set of display pixels illuminates the same area of the placement surface from below and, on the other hand, light of the first wavelength $\lambda_R$ which is incident on the sensor pixels from a direction of the placement surface is detected by a first set of sensor pixels and is captured as a first image, and light of the second wavelength $\lambda_F$ which is incident on the sensor pixels from a direction of the placement surface is detected by a second set of sensor pixels and is simultaneously recorded as a second image, analyzing the first image and second image with respect to differences in their image characteristics.

23. The method according to claim 22, in which, in order to scan the largest possible portion of the placement surface, the area illuminated from below is successively displaced after the first image and second image have been captured so that the first set of display pixels and the second set of display pixels are also displaced and further first and second images are captured and are combined to form a first aggregate image and a second aggregate image.

24. The method according to claim 22, wherein display pixels of the first set of display pixels and display pixels of the second set of display pixels are distributed in a checkerboard manner, and an allocation to the first set or second set of display pixels is carried out based on color filters.

\* \* \* \* \*